US012796157B2

(12) United States Patent
Yan et al.

(10) Patent No.: US 12,796,157 B2
(45) Date of Patent: Nov. 10, 2026

(54) SOLAR CELL STRUCTURE, METHOD FOR MANUFACTURING SOLAR CELL STRUCTURE, AND SOLAR CELL

(71) Applicant: YINGKOU JINCHEN MACHINERY CO., LTD., Yingkou (CN)

(72) Inventors: Baojie Yan, Yingkou (CN); Yuming Wang, Yingkou (CN); Ke Tao, Yingkou (CN)

(73) Assignee: YINGKOU JINCHEN MACHINERY CO., LTD., Yingkou (CN)

( * ) Notice: Subject to any disclaimer, the term of this patent is extended or adjusted under 35 U.S.C. 154(b) by 0 days.

(21) Appl. No.: 18/969,620

(22) Filed: Dec. 5, 2024

(65) Prior Publication Data

US 2025/0374708 A1 Dec. 4, 2025

Related U.S. Application Data

(63) Continuation of application No. PCT/CN2024/130504, filed on Nov. 7, 2024.

(30) Foreign Application Priority Data

May 28, 2024 (CN) ........................ 202410668742.5

(51) Int. Cl.
*H10F 77/20* (2025.01)
*H10F 10/14* (2025.01)
(Continued)

(52) U.S. Cl.
CPC ......... *H10F 77/219* (2025.01); *H10F 10/146* (2025.01); *H10F 71/121* (2025.01);
(Continued)

(58) Field of Classification Search
CPC .... H10F 77/219; H10F 71/129; H10F 71/121; H10F 77/311; H10F 10/146;
(Continued)

(56) References Cited

U.S. PATENT DOCUMENTS

2014/0370716 A1* 12/2014 Lee .................... H10F 71/1395
438/715
2020/0287066 A1 9/2020 Eugène
(Continued)

FOREIGN PATENT DOCUMENTS

CN 111725359 * 11/2021
CN 114975691 A 8/2022
(Continued)

OTHER PUBLICATIONS

International Search Report in the international application No. PCT/CN2024/130504, mailed on Jan. 28, 2025.
(Continued)

*Primary Examiner* — Monica D Harrison
*Assistant Examiner* — Jacob T Nelson
(74) *Attorney, Agent, or Firm* — Syncoda LLC; Feng Ma

(57) ABSTRACT

A solar cell structure, a method for manufacturing a solar cell structure, and a solar cell are provided. The method includes: forming a precursor structure on a surface of a base, the precursor structure including a first tunnel layer covering the base surface, and an amorphous silicon layer covering a surface of the first tunnel layer; annealing the amorphous silicon layer to form a first polysilicon contact layer; laser oxidizing the first polysilicon contact layer to pattern it and to oxidize a portion of a thickness of the first polysilicon contact layer to form a patterned silicon oxide mask layer; removing the amorphous silicon layer and/or the first polysilicon contact layer in a region not covered by the patterned silicon oxide mask layer; removing the silicon oxide mask layer; and forming a first metal electrode on a surface of a remaining portion of the first polysilicon contact layer.

15 Claims, 3 Drawing Sheets

(51) Int. Cl.

| | |
|---|---|
| ***H10F 10/165*** | (2025.01) |
| ***H10F 71/00*** | (2025.01) |
| ***H10F 77/30*** | (2025.01) |

(52) U.S. Cl.
CPC ......... *H10F 71/129* (2025.01); *H10F 77/311* (2025.01); *H10F 77/315* (2025.01)

(58) Field of Classification Search
CPC ...... H10F 77/315; H10F 71/103; H10F 71/10; H10F 71/128; H10F 77/211; H10F 71/131; H10F 10/00; Y02E 10/50; Y02P 70/50
See application file for complete search history.

(56) References Cited

U.S. PATENT DOCUMENTS

| | | | | |
|---|---|---|---|---|
| 2023/0307573 | A1* | 9/2023 | Yang | H10F 71/131 |
| 2025/0169221 | A1* | 5/2025 | Gao | H10F 77/211 |
| 2025/0324809 | A1* | 10/2025 | Jin | H10F 77/1223 |

FOREIGN PATENT DOCUMENTS

| | | | |
|---|---|---|---|
| CN | 116936675 | * | 10/2023 |
| CN | 117673207 | A | 3/2024 |
| CN | 118507591 | A | 8/2024 |
| WO | 2023235390 | A2 | 12/2023 |

OTHER PUBLICATIONS

Supplementary European Search Report in the European application No. 24812681.5, mailed on Jun. 29, 2026.

* cited by examiner

SOLAR CELL STRUCTURE, METHOD FOR MANUFACTURING SOLAR CELL STRUCTURE, AND SOLAR CELL

CROSS-REFERENCE TO RELATED APPLICATIONS

This is a continuation of International Patent Application No. PCT/CN2024/130504 filed on Nov. 7, 2024, which claims priority to Chinese Patent Application 202410668742.5 filed on May 28, 2024. The disclosures of these applications are hereby incorporated by reference in their entirety.

BACKGROUND

An N-type Tunnel Oxide Passivated Contact (TOPCon) solar cell has high photoelectric conversion efficiency, and its manufacturing process is compatible with the manufacturing process of the traditional P-type Passivated Emitter and Rear Cell (PERC) solar cell. Thus, the N-type TOPCon solar cell has become the first technology for the new production line of the crystalline silicon (c-Si) solar cell. A rear tunnel passivation contact layer (n-TOPCon) of the TOPCon solar cell has been greatly optimized, so that it may provide good passivation quality and low contact resistance. However, the front-side structure of the cell still affects the efficiency of the solar cell, and thus there is a large room for optimization.

SUMMARY

Embodiments of the present disclosure relate to the technical field of solar cell manufacturing.

The technical problem to be solved by the embodiments of the present disclosure is to provide a solar cell structure, a method for manufacturing a solar cell structure, and a solar cell.

In an aspect, the embodiments of the present disclosure provide a method for manufacturing a solar cell structure, which includes the following operations.

A precursor structure is formed on a surface of a base, in which the precursor structure includes a first tunnel layer covering the surface of the base, and an amorphous silicon layer covering a surface of the first tunnel layer.

The amorphous silicon layer is annealed to form a first polysilicon contact layer.

The first polysilicon contact layer is laser oxidized to pattern the first polysilicon contact layer and to oxidize a portion of a thickness of the first polysilicon contact layer, to form a patterned silicon oxide mask layer.

The amorphous silicon layer and/or the first polysilicon contact layer in a region which is not covered by the patterned silicon oxide mask layer are/is removed.

The silicon oxide mask layer and the first tunnel layer in a region which is not covered by the silicon oxide mask layer are removed.

A first metal electrode is formed on a surface of a remaining portion of the first polysilicon contact layer.

In another aspect, the embodiments of the present disclosure provide a solar cell structure, which includes a base, and a Tunnel Oxide Passivated Contact (TOPCon) structure arranged on the base.

The TOPCon structure includes a first tunnel layer, a first polysilicon contact layer and a first metal electrode, which are patterned and are sequentially stacked on one another. Projections of the first tunnel layer, the first polysilicon contact layer and the first metal electrode on a surface of the base coincide with each other.

In yet another aspect, the embodiments of the present disclosure provide a solar cell, which includes one or more solar cell structures as described above.

BRIEF DESCRIPTION OF THE DRAWINGS

One or more embodiments are exemplarily explained through the figures in accompanying drawings corresponding thereto. Unless otherwise specifically declared, the figures in the accompanying drawings do not constitute a scale limitation.

Figure 1:
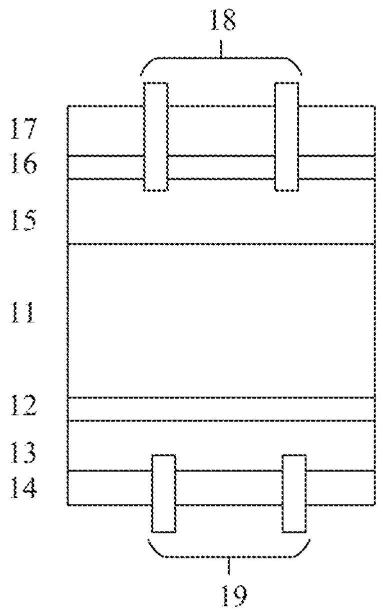
FIG. 1 is a schematic view of a solar cell structure.

In the figures: 11—N-type crystalline silicon; 12—tunnel oxide layer; 13—polysilicon thin film layer; 14—silicon nitride passivation layer; 15—emitter; 16—alumina passivation layer; 17—silicon nitride antireflection layer; 18—positive electrode grid line; 19—negative electrode grid line; 210—selective emitter; 41—silicon wafer substrate; 42—ultra-thin silicon oxide tunnel layer; 43—P-type amorphous silicon layer; 44—first laser; 45—second laser; 46—polysilicon contact layer; 47—silicon oxide mask layer; 46(1)—remaining polysilicon thin film layer 46 after partial oxidation; 500—solar cell structure; 510—base; 520—TOPCon structure; 521—first tunnel layer; 522—first polysilicon contact layer; 523—first metal electrode; 511—crystalline silicon substrate; 512—P-type emitter layer; 530—first passivation layer; 540—first antireflection layer; 550—second tunnel layer; 560—second polysilicon contact layer; 570—second metal electrode; 580—second passivation layer; 600—solar cell.

DETAILED DESCRIPTION

In order to describe the technical solutions in embodiments of the present disclosure more clearly, the accompanying drawings required to be used in description of the embodiments will be simply introduced below. Apparently, the accompanying drawings in the following description show merely some examples or embodiments of the present disclosure, and a person of ordinary skill in the art may still apply the present disclosure to other similar situations from these accompanying drawings without creative effort. Unless obvious from the language environment or otherwise explained, the same reference numeral denotes the same structure or operation.

Many specific details are set forth in the following description in order to fully understand the present disclosure. However, the present disclosure can be implemented in many other ways different from those described herein. Therefore, the present disclosure is not limited by specific embodiments disclosed below.

As described in the present disclosure and the claims, unless the context clearly indicates an exception, “a”, “an”, "one" and/or "the" do not specifically refer to a singular form, and may also include a plural form. In general, the terms "comprise" and "include" merely suggest the inclusion of explicitly identified operations and elements, and these operations and elements do not constitute an exclusive list, and the method or apparatus may also include other operations or elements.

Unless specifically stated otherwise, the relative arrangement of components and operations, numerical expressions, and numerical values set forth in these embodiments do not limit the scope of the present disclosure. Meanwhile, it should be understood that for ease of description, the sizes of the various components shown in the accompanying drawings are not drawn according to actual scale. Techniques, methods and apparatus known to those of ordinary skill in the related art may not be discussed in detail. However, where appropriate, said techniques, methods and apparatus should be considered as part of the authorized specification. In all examples shown and discussed herein, any specific values should be construed as merely exemplary, but not as limitation. Thus, other examples of exemplary embodiments may have different values. It should be noted that: similar reference numerals and letters denote similar items in the following accompanying drawings. Thus, once a certain item is defined in one drawing, it does not need to be further discussed in other drawings.

When the embodiments of the present disclosure are described in detail, for the convenience of description, the cross-sectional diagram showing the device structure may not be partially enlarged according to a general scale, and the schematic diagram is only an example, and should not limit the protection scope of the present disclosure herein. In addition, three-dimensional space dimensions (length, width and depth) should be included in actual production.

In the description of the present disclosure, it should be noted that direction wordings such as "front", "rear", "upper", "lower", "left", "right", "transversal", "vertical", "perpendicular", "horizontal", "top", "bottom" and the like that indicate relations of directions or positions are generally based on the relations of directions or positions shown in the drawings, which are only to facilitate description of the present disclosure and to simplify the description of the present disclosure. Without contrary description, these direction wordings do not indicate and imply that the referred device or element must have the specific direction or must be constructed and operated in the specific direction. Therefore, these direction wordings shall not be interpreted as limiting the protection scope of the present disclosure. The direction wordings "inner" and "outer" refer to the inside and outside with respect to the profile of each component itself.

For ease of description, spatially relational terms such as "below", "under", "lower", "beneath", "on", and "upper" may be used herein to describe the relationship between an element or feature shown in the drawings and other elements or features. It should be understood that, other than the orientation shown in the drawings, these spatially relational terms are intended to include other orientations of the devices in use or in operation. For example, if the device in the drawings is reversed, then elements described as "under", or "below", or "beneath" other elements or features will be oriented to be "above" other elements or features. Therefore, the exemplary terms "under" and "below" may include both upper and lower orientations. The device may have other orientations (rotated by 90 degrees or in other orientations), and thus the spatial relationship descriptors used herein should be interpreted accordingly. Further, it should be understood that when a layer is referred to as being "between" two layers, this layer may be the only one layer between these two layers, or there may also be one or more intermediate layers.

In the present disclosure, the described structure in which the first feature is "on" the second feature may include embodiments in which the first feature and the second feature are formed in direct contact with each other, or may include embodiments in which additional features are formed between the first feature and the second feature, such that the first feature and the second feature may not be in direct contact with each other.

Further, it should be noted that, using terms "first", "second" and so on to define components is only for distinguishing the corresponding components. Unless otherwise stated, the above terms have no special meaning, and thus cannot be understood as limiting the protection scope of the present disclosure. In addition, although the terms used in the present disclosure are selected from well-known and commonly used terms, some terms mentioned in the specification of the present disclosure may be selected by the applicant according to his/her judgment, and the detailed meaning of these terms are explained in the corresponding portions of the description herein. Further, it is required that the present disclosure is understood not only through the actual terms used, but also through the meaning of each term.

An N-type TOPCon solar cell has high photoelectric conversion efficiency, and its manufacturing process is compatible with the manufacturing process of the traditional P-type PERC solar cell. Thus, the N-type TOPCon solar cell has become the first technology for the new production line of the crystalline silicon solar cell. The structure of the N-type TOPCon solar cell is shown in FIG. 1. An ultra-thin tunnel oxide layer 12 ($SiO_x$) and a high phosphorus (P) doped polysilicon thin film layer 13 ($n^{++}$-poly-Si) are prepared on the rear side of the N-type crystalline silicon 11. The ultra-thin tunnel oxide layer 12 and the high phosphorus doped polysilicon thin film layer 13 collectively form a passivation contact structure, which provides good surface passivation for the rear side of the silicon wafer. The ultra-thin oxide layer 12 may allow the majority carrier to enter the polysilicon thin film layer 13 in a tunneling or pinhole transmission manner while blocking the passage of the minority carrier, so that the majority carrier is transversely transmitted in the polysilicon thin film layer 13 and is collected by the metal of a negative electrode grid line 19, thereby greatly reducing the metal contact recombination current, and increasing the open circuit voltage and short circuit current of the cell. Furthermore, a silicon nitride passivation layer 14 ($SiN_x$) may be further deposited on the polysilicon thin film layer 13 on the rear side, so as to complete the selective contact and passivation on the rear side of the cell. On the front side of the cell, an emitter 15 is formed through the traditional boron (B) diffusion technology, and then an alumina passivation layer 16 ($Al_2O_3$) and a silicon nitride antireflection layer 17 ($SiN_x$) are deposited on the front side, and finally a positive electrode grid line 18 and a negative electrode grid line 19 of the cell are formed by screen printing silver slurry or silver aluminum slurry and sintering. The tunnel passivation contact layer (n-TOPCon) on the rear side of the TOPCon solar cell has been greatly optimized, which may provide good passivation quality and lower contact resistance. Compared to the PERC cell, the efficiency of the TOPCon solar cell has been greatly improved, and the mass production efficiency of the TOPCon solar cell may reach a level of 25% to 26%.

In order to further improve the efficiency of the N-type TOPCon solar cell, it is necessary to optimize the cell structure on the front side in a manner that most of the front side of the TOPCon solar cell is covered with the $Al_2O3$ passivation layer and the $SiN_x$ antireflection layer. The electrode grid line is in contact with $Al_2O3$ and $SiN_x$ by screen printing and sintering, and the slurry penetrates through $Al_2O3$ and $SiN_x$ in the sintering process and is in direct contact with the P-type emitter arranged below. Since the B doping concentration of the P-type emitter is not high enough, the contact resistance between the grid line and the emitter may directly affect the Fill Factor (FF) of the cell. Further, since the contact between the grid line and the P-type emitter is direct metal/semiconductor contact, the interface defect state is relatively high, which affects the passivation quality, thereby reducing the open circuit voltage (Voc) of the cell.

Figure 2:
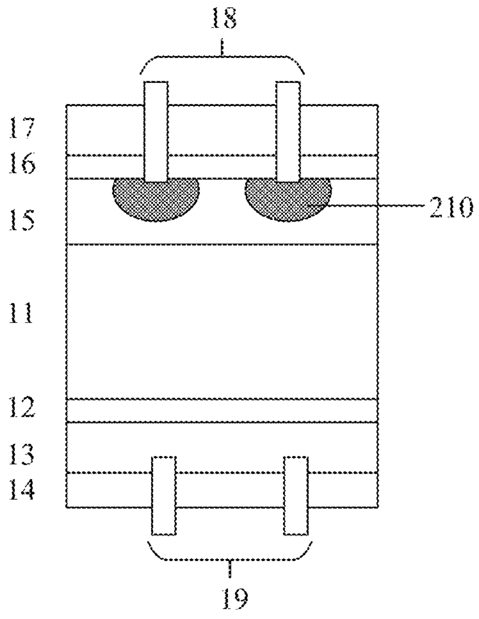
FIG. 2 is a schematic view of another solar cell structure.

In order to solve the problem of the metal/semiconductor contact and the contact resistance between the grid line and the P-type emitter affecting passivation, a Selective Emitter (SE) may be used, that is, a high B doped region ($p^{++}$) is introduced between the metal gird line and the P-type emitter, and in this case, the cell structure is shown in FIG. 2. In FIG. 2, the high B doped region is a selective emitter 210. On the one hand, the introduction of the high B doped region may effectively reduce the contact resistance of the gird line, thereby increasing the FF of the cell; and on the other hand, the introduction of the high B doped region may effectively reduce the density of recombination centers at the interface between the metal electrode and the high B doped region, thereby effectively improving the passivation quality of the interface, and increasing the Voc of the cell. However, since the diffusion coefficient of B diffusion in silicon is smaller than the diffusion coefficient of phosphorus (P) diffusion in silicon, it is difficult to form a high B doped region in the N-type c-Si, which requires a higher temperature (greater than 1000° C.). Highly doped SE may be effectively prepared through the laser annealing and thermal oxidation technology on the production line, thereby improving the efficiency of the TOPCon solar cell. The use of the laser SE technology may increase the mass production efficiency of the TOPCon solar cell to more than 26%.

In some embodiments, the Laser Enhanced Contact Optimization (LECO) technology may also be used. This technology uses laser irradiation to generate a strong reverse photocurrent under the condition of reverse bias after screen printing, so as to form local heating at the metal/emitter to form a silver-silicon alloy at the interface, thereby effectively reducing the contact resistance, which achieves the same effect as the laser SE. Compared to the laser SE process, the LECO has simpler process and lower equipment cost.

Figure 3:
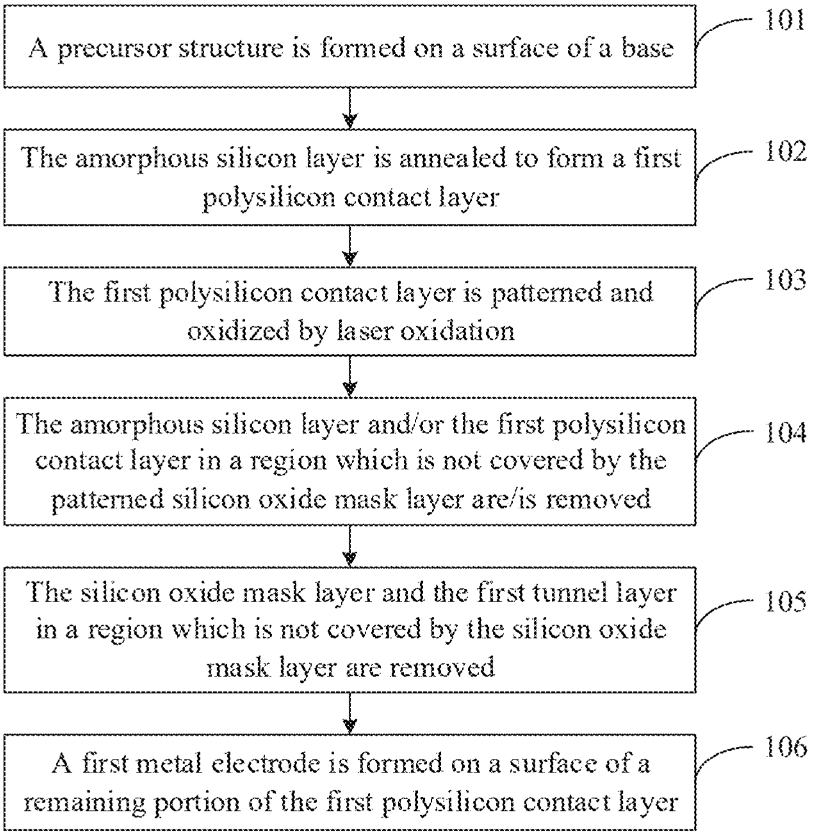
FIG. 3 is a flowchart of a method for manufacturing a solar cell structure according to an embodiment of the present disclosure.

However, whether it is the laser SE technology or the LECO technology, the contact between the grid line and the silicon is still the metal/semiconductor contact. In order to solve the problem of the metal/semiconductor contact, the embodiments of the present disclosure provide a method for manufacturing a solar cell. As shown in FIG. 3, the method includes the following operations.

In operation 101, a precursor structure is formed on a surface of a base, in which the precursor structure includes a first tunnel layer covering the surface of the base, and an amorphous silicon layer covering a surface of the first tunnel layer.

In operation 102, the amorphous silicon layer is annealed to form a first polysilicon contact layer.

In operation 103, the first polysilicon contact layer is laser oxidized to pattern the first polysilicon contact layer and to oxidize a portion of a thickness of the first polysilicon contact layer, to form a patterned silicon oxide mask layer.

In operation 104, the amorphous silicon layer and/or the first polysilicon contact layer in a region which is not covered by the patterned silicon oxide mask layer are/is removed.

In operation 105, the silicon oxide mask layer and the first tunnel layer in a region which is not covered by the silicon oxide mask layer are removed.

In operation 106, a first metal electrode is formed on a surface of a remaining portion of the first polysilicon contact layer.

Herein, the first tunnel layer may be an ultra-thin silicon oxide layer, which is configured for tunneling the majority carrier into the first polysilicon contact layer, and which may effectively block the passage of the minority carrier. The majority carrier is collected by the first metal electrode through the first polysilicon contact layer, so that the recombination current of the metal contact may be reduced, and the open circuit voltage and the short circuit current of the cell may be increased.

The first polysilicon contact layer may be a thin film formed by a high phosphorus doped polysilicon material, i.e., $n^{++}$-poly-Si. In the embodiments of the present disclosure, the precursor may be firstly formed on the base, and then the precursor is processed, so as to obtain the above first polysilicon layer.

Specifically, the precursor includes an amorphous silicon layer. By crystallizing the amorphous silicon layer, the polysilicon may be obtained. Herein, an annealing method may be used for crystallization treatment. After crystallization, a patterned silicon oxide mask layer is formed by laser oxidation. That is, the surface of the polysilicon is oxidized by laser oxidation, so as to form a patterned mask, which facilitates subsequent removal of the excess amorphous silicon layer or the first polysilicon contact layer through a process such as etching or cleaning.

Herein, the amorphous silicon layer covers the entire surface. The annealing treatment in the above operation 102 may be the patterned annealing treatment or the entire surface annealing treatment. In a case of the patterned annealing treatment, only the region in which the first metal electrode needs to be formed may be annealed, and the polysilicon layer arranged thereon may be further laser oxidized. In this case, the region which is not covered by the silicon oxide mask layer is an amorphous silicon layer, and thus the amorphous silicon layer is removed in operation 104. It should be noted that since the patterned range corresponding to the patterned annealing treatment may be larger than the patterned range corresponding to the laser oxidation, the region which is not covered by the silicon oxide mask layer may include a partially crystallized polysilicon layer in addition to the amorphous silicon layer. Thus, in operation 104, the amorphous silicon layer and the polysilicon layer may be removed.

Then, the silicon oxide mask layer and the excess first tunnel layer may be simultaneously removed.

In this way, a locally patterned p-TOPCon structure stacked on the surface of the base is formed. Then, an upper electrode of the grid line structure is formed on the p-TOPCon structure, so as to obtain a selective emitter with the p-TOPCon structure.

It can be understood that the laser may realize the patterning treatment with narrower line width, and the range of patterning may be realized by adjusting the spot size of the laser, so that the diameter of the spot may be controlled in the range of 10 μm or even smaller. Currently, the width of the grid line of the solar cell is about 30 μm, thus, the above method may be applied to the manufacturing process of the solar cells at present and even in the future. Further, fast treatment is achieved by laser high-speed scanning. Compared to the photolithography treatment, there is no need for auxiliary materials such as mask template, photoresist and ink, the processes are fewer, the efficiency is high, and the cost is low. Moreover, for the laser treatment, there is no need to contact the surface of the film layer, thereby reducing the process problems such as scratch.

In some embodiments, the above operation that the amorphous silicon layer is annealed to form the first polysilicon contact layer includes the following operations.

The amorphous silicon layer is laser annealed to form the first polysilicon contact layer.

Alternatively, the amorphous silicon layer is thermally annealed to form the first polysilicon contact layer.

In the embodiments of the present disclosure, the annealing treatment for crystallizing the amorphous silicon as described above may be a laser annealing treatment or a thermal annealing treatment. It can be understood that if the laser annealing treatment is used, the same patterning treatment as the laser oxidation may be performed, that is, only the amorphous silicon in a partial region is annealed. If the thermal annealing treatment is used, the amorphous silicon on the entire surface is crystallized.

It should be noted that through the thermal annealing treatment, the amorphous silicon on the entire surface may be crystallized into the polysilicon, and part of the boron atoms doped in the polysilicon may be diffused into the base, thereby increasing the doping concentration of the emitter, and improving the efficiency of the cell.

In some embodiments, the above operation that the amorphous silicon layer is annealed to form the first polysilicon contact layer includes the following operation.

The amorphous silicon layer is annealed in a vacuum environment or an inert gas environment to form the first polysilicon contact layer.

Correspondingly, in some embodiments, the operation that the first polysilicon contact layer is laser oxidized to pattern the first polysilicon contact layer and to oxidize the portion of the thickness of the first polysilicon contact layer, to form the patterned silicon oxide mask layer includes the following operation.

The first polysilicon contact layer is laser scanned in an oxygen-containing environment to pattern the first polysilicon contact layer and to oxidize the portion of the thickness of the first polysilicon contact layer, to form the patterned silicon oxide mask layer.

In some embodiments, the operation that the amorphous silicon layer is laser annealed to form the first polysilicon contact layer includes the following operation.

The amorphous silicon layer is patterned by laser annealing to form a patterned first polysilicon contact layer, in which a patterned region of the silicon oxide mask layer is arranged within a patterned region of the first polysilicon contact layer.

That is, the laser annealing treatment here is a patterning treatment similar to the laser oxidation treatment, so that crystallization may be achieved efficiently and rapidly, and only the region in which the TOPCon structure is located is needed to be treated, which has high efficiency and more flexible patterning treatment.

It may be understood that the laser oxidation treatment is to form a patterned mask layer, so that the position covered by the patterned region of the patterned mask layer is the position where the TOPCon structure is located. The range of the patterned region of the laser annealing may be larger than the range of the laser oxidation treatment, thereby ensuring that the amorphous silicon in the region subjected to the laser oxidation treatment all has been crystallized into polysilicon.

In some embodiments, a projection of the patterned region of the silicon oxide mask layer in a direction perpendicular to the surface of the base coincides with a projection of the patterned region of the first polysilicon contact layer in the direction perpendicular to the surface of the base.

Herein, the patterned region corresponding to the laser annealing treatment is consistent with the patterned region corresponding to the laser oxidation treatment, and they may be realized by the same laser beam. That is, the laser annealing treatment and the laser oxidation treatment as described above may be realized by using the same laser beam to scan twice in an oxygen-free environment and an oxygen-containing environment respectively, so that the efficiency is higher, and there is no need for complicated parameter adjustments. Of course, different lasers may also be used according to difference between the laser annealing process and the laser oxidation process.

In some embodiments, the above operation that the precursor structure is formed on the surface of the base includes the following operations.

A silicon oxide material is prepared on the surface of the base to form the first tunnel layer.

An amorphous silicon material doped with boron element is prepared on the surface of the first tunnel layer to form a P-type amorphous silicon layer.

In some embodiments, the above operation that the silicon oxide material is prepared on the surface of the base to form the first tunnel layer includes the following operation.

The silicon oxide material is prepared on the surface of the base by plasma assisted oxidation through a Plasma Enhanced Chemical Vapor Deposition (PECVD) process to form the first tunnel layer.

Specifically, an ultra-thin silicon oxide layer may be prepared on the surface of the base as the above first tunnel layer by using a tube-type PECVD or a plate-type PECVD.

The reaction chamber of the tube-type PECVD device may adopt a quartz tube structure, and the process gas enters the reaction chamber through the inlet flange to deposit a thin film. The tube-type PECVD has the advantages of low temperature, high speed and high film uniformity, which is an efficient and flexible thin film deposition technology.

The plate-type PECVD adopts a deposition cavity, a gas delivery system, a discharge power supply, a vacuum system and other components. The design of parallel plates may allow the plasma to be evenly distributed in the deposition region, thereby improving the uniformity and quality of the thin film.

The tube-type PECVD and the plate-type PECVD may be used not only for preparing the silicon dioxide thin film of the above tunnel layer, but also for depositing film layers, such as an antireflection film and a passivation film.

In some embodiments, the above operation that the amorphous silicon material doped with boron element is prepared on the surface of the first tunnel layer to form the P-type amorphous silicon layer includes the following operation.

The amorphous silicon material doped with boron element is prepared on the surface of the first tunnel layer through a Plasma Enhanced Chemical Vapor Deposition (PECVD) or a Low Pressure Chemical Vapor Deposition (LPCVD) to form the amorphous silicon layer.

The amorphous silicon layer may also be prepared through the plate-type PECVD or the tube-type PECVD as described above. Further, the amorphous silicon layer may also be prepared through the LPCVD.

In LPCVD, a chemical reaction is performed at a lower air pressure (below atmospheric pressure) to deposit the gaseous material as a solid thin film on a surface of a wafer. In the low pressure environment, molecular density is reduced, contamination and molecular interference are reduced, and molecular mean free path is increased, thereby increasing the reaction rate and uniformity, and improving the quality of the thin film.

An LPCVD device includes a vertical LPCVD device and a horizontal LPCVD device, the main differences therebetween are the arrangement of the base plate and the gas flow mode. The vertical LPCVD facilitates to realize the uniformity in thin film deposition, while the horizontal LPCVD has a simpler system and lower cost.

In practical applications, deposition of the above silicon dioxide thin film and the amorphous silicon thin film may select any one of the deposition methods as described above according to the equipment in the actual production line and the specific requirements of the film layer, or may select other deposition methods which are not exemplified in the embodiments of the present disclosure, the deposition method is not specifically limited in the present disclosure.

In some embodiments, a thickness of the silicon oxide mask layer is less than a thickness of the remaining portion of the first polysilicon contact layer. Exemplarily, in some embodiments, a thickness of the silicon oxide mask layer is between 10 nanometers and 200 nanometers, and the thickness of the first polysilicon contact layer is between 30 nanometers and 200 nanometers. Further, a thickness of the amorphous silicon layer is between 50 nanometers and 500 nanometers. Since the silicon oxide mask layer only needs to be used as a mask and will be removed in an intermediate process, the silicon oxide mask layer only needs to have a thinner thickness to ensure good prevention of alkali etching. However, the thickness of the first polysilicon contact layer needs to meet the requirements of the TOPCon structure. Thus, the thickness of the silicon oxide mask layer may be less than the thickness of the first polysilicon contact layer, that is, it is only necessary to oxidize a very thin layer of the original first polysilicon contact layer.

In some embodiments, the above operation that the amorphous silicon layer and/or the first polysilicon contact layer in the region which is not covered by the patterned silicon oxide mask layer are/is removed includes the following operation.

The amorphous silicon layer and/or the first polysilicon contact layer in the region which is not covered by the patterned silicon oxide mask layer are/is cleaned through an alkali etching process.

Alkali etching refers to that, strong alkali solutions, such as sodium hydroxide solution and potassium hydroxide solution, are used to chemically react with the material to be etched, so as to dissolve specific layers or impurities on the surface of the material to be etched. By controlling the reaction time and conditions, the target part may be accurately removed. In the embodiments of the present disclosure, alkali etching is used to remove the excess amorphous silicon layer or the excess first polysilicon contact layer without reacting with the silicon oxide. Thus, the first polysilicon contact layer covered by the silicon oxide mask layer will not be removed.

In some embodiments, the above operation that the silicon oxide mask layer and the first tunnel layer in the region which is not covered by the silicon oxide mask layer are removed includes the following operation.

The silicon oxide mask layer and the first tunnel layer in the region which is not covered by the silicon oxide mask layer are removed through an acid etching process.

The precursor includes the first tunnel layer covering the base. This first tunnel layer and the silicon oxide mask layer are both made of silicon oxide material and may be simultaneously removed. Herein, an acidic solution is used for cleaning to remove excess silicon oxide material. However, the first tunnel layer covered by the first polysilicon contact layer is not removed. In this way, the remaining portion of the first tunnel layer and the first polysilicon contact layer form a patterned p-TOPCon structure.

Acid etching is similar to alkali etching. However, the acidic solution for etching may chemically react with the silicon oxide material to remove the silicon oxide material, but not remove the polysilicon material.

In some embodiments, the above operation that the first metal electrode is formed on the surface of the remaining portion of the first polysilicon contact layer includes the following operations.

A patterned metal slurry is screen printed on the surface of the first polysilicon contact layer.

The metal slurry is sintered to form the first metal electrode.

In some embodiments, the above manufacturing method further includes the following operation.

Boron ion doping is performed on a surface of a crystalline silicon substrate to form a P-type emitter, in which the crystalline silicon substrate and the P-type emitter form the base.

In some embodiments, the above manufacturing method further includes the following operation.

A first passivation layer and a first antireflection layer are sequentially stacked on a surface of the base on which the first metal electrode is formed, in which the first passivation layer and the first antireflection layer cover a region absent of the first metal electrode.

Specifically, the first passivation layer may be made of alumina ($Al_2O_3$), and the material of the first antireflection layer may be a silicon nitride material ($SiN_x$). The first passivation and the first antireflection layer realize the surface passivation of the P-type emitter for selective contact.

In some embodiments, the above manufacturing method further includes the following operations.

A second tunnel layer and a second polysilicon contact layer are sequentially formed on a rear side of the base, in which a doping polarity of the second polysilicon contact layer is opposite to a doping polarity of the first polysilicon contact layer, i.e., an N-type polysilicon layer.

A second metal electrode is formed on a surface of the second polysilicon contact layer.

A second passivation layer is formed on the surface of the second polysilicon contact layer in a region absent of the second metal electrode. The second passivation layer may be $SiN_x$, or an $Al_2O_3/SiN_x$ bilayer structure.

The solar cell structure provided by the embodiments of the present disclosure may be a double-sided TOPCon structure. Thus, the rear side of the base is also provided with a tunnel layer and a polysilicon contact layer. Herein, the second polysilicon contact layer may be made of a high phosphorus doped polysilicon material, thereby forming a passivation layer contact structure on the entire surface of the electrode. In addition, the surface of the second polysilicon contact layer absent of the second metal electrode may be covered with a silicon nitride single layer material or an alumina/silicon nitride bilayer material to form a second passivation layer, so as to realize the surface passivation of the rear side of the cell.

The embodiments of the present disclosure also provide the following examples.

Figure 4:
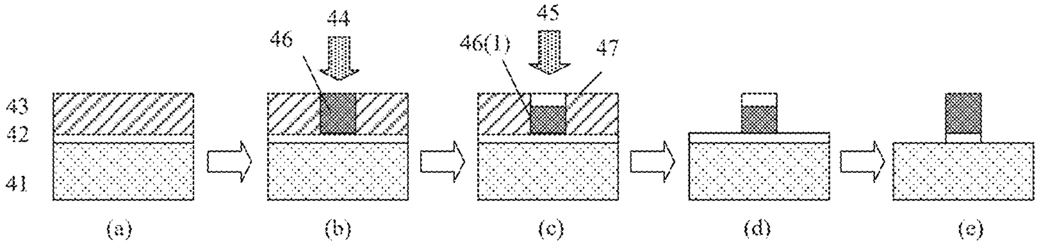
FIG. 4 is a schematic diagram of a manufacturing process of a solar cell structure according to an embodiment of the present disclosure.

As shown in FIG. 4, the embodiments of the present disclosure provide a method for manufacturing a solar cell structure, which includes the following operations.

a. An ultra-thin silicon oxide tunnel layer 42 is prepared on a surface of a silicon wafer substrate 41 through a tube-type PECVD or a plate-type PECVD, and a boron doped amorphous silicon is deposited through a vacuum coating process to form a P-type amorphous silicon layer 43, in which the ultra-thin silicon oxide tunnel layer and the amorphous silicon layer form a composite layer as a basic structure (a precursor) for preparing a p-TOPCon.

b. The amorphous silicon layer is crystallized through a laser annealing process performed by a first laser 44 in a vacuum environment or an inert gas environment, so as to obtain a patterned polysilicon contact layer 46, that is, p-a-Si:H is crystallized to form the p-TOPCon with a patterned SiOx/$p^{++}$-poly-Si bilayer structure. In this operation, thermal annealing crystallization may also be used. If the thermal annealing is used, the entire p-a-Si:H is crystallized to form $p^{++}$-poly-Si, and meanwhile, part of B atoms in $p^{++}$-poly-Si may be diffused into c-Si to increase the doping concentration in the emitter and change the distribution of B atoms in the emitter, thereby further improving the efficiency of the cell.

c. The patterned polysilicon contact layer is partially oxidized by a second laser scanning with a second laser 45 in an oxygen-containing atmosphere, so as to form a silicon oxide mask layer 47 on the surface of the patterned polysilicon contact layer, and meanwhile, most of thickness at the bottom is not oxidized to form a patterned polysilicon thin film layer 46(1) as a contact layer of p-TOPCon. The laser oxidation process is adjusted and optimized, so that only the surface of the patterned polysilicon contact layer is formed with a silicon oxide mask layer conforming to the design thickness. Exemplary, the thickness of the oxide film layer may be adjusted by adjusting parameters such as laser intensity and wavelength, or adjusting oxygen concentration in the environment. The width of each of the patterned polysilicon thin film layer and the silicon oxide mask layer ranges from 5 μm to 30 μm, the thickness of the polysilicon thin film layer ranges from 30 nm to 200 nm, and the thickness of the silicon oxide mask layer ranges from 10 nm to 200 nm. Laser crystallization and laser oxidation are fast, and the time required for crystallization and oxidation is determined by the speed of laser scanning, which ensures that the production capacity for a single machine is large, and there is no need for additional consumables, such as photoresist for photolithography, so that the production and operation costs are low, which is unmatched by the photolithography technology.

d. The amorphous silicon layer in a region which is not scanned by laser is cleaned through an alkali etching process.

e. The excess silicon oxide mask layer on the localized patterned polysilicon thin film layer and the ultra-thin silicon oxide tunnel layer is cleaned by acid cleaning, so as to form a localized patterned p-TOPCon structure. The patterned p-TOPCon structure is screen printed and then sintered to form an upper electrode of a grid line structure, so as to obtain a selective emitter with a p-TOPCon structure. By combining laser crystallization and laser oxidation, a $p^{++}$-poly-Si contact layer with a very narrow line may be prepared. Currently, the width of the grid line for screen printing is generally 30 μm, which may be close to 20 μm after optimization. The line width for laser crystallization and laser oxidation is determined by the spot size of the laser, and the diameter of the spot may be easily controlled in the range of 10 μm or less. Thus, the $p^{++}$-poly-Si patterning solution disclosed in the present disclosure may provide any line width required for the metallization of the TOPCon solar cell, and this advantage cannot be achieved by template mask and ink patterning technologies.

Specifically, the vacuum coating process includes PECVD or LPCVD. In operation a, the thickness of each of the amorphous silicon layer and the patterned polysilicon contact layer ranges from 30 nm to 500 nm, for example, 50 nm. In operation b and operation c, the laser device used in the laser process includes an ultraviolet laser device, a visible laser device, or an infrared laser device.

Overall, the present disclosure provides a method for manufacturing a double-sided TOPCon structure of a solar cell. A B doped a-Si:H thin film is deposited through PECVD, and a patterned $p^{++}$-poly-Si/$SiO_x$ is prepared on a surface of c-Si by combining the laser annealing crystallization and laser oxidation technologies, in which $SiO_x$ formed by laser oxidation is used as a protective layer for alkali etching, and the amorphous silicon (p-a-Si:H) or the polysilicon ($p^{++}$-poly-Si) in the region which is not subjected to laser oxidation is etched off by alkali etching, so as to form a p-TOPCon structure corresponding to the screen printing pattern, thereby improving the efficiency of the TOPCon solar cell. This technology may also use the Low Pressure Chemical Vapor Deposition (LPCVD) to prepare an intrinsic poly-Si, and then B diffusion is performed to turn the intrinsic poly-Si into $p^{++}$-poly-Si. A $SiO_x$ pattern corresponding to the grid line is formed by laser oxidation, and then a patterned p-TOPCon is formed after alkali etching. Due to high precision of the laser technology, a narrower line width may be achieved to meet the requirements for high efficiency of the solar cell. The high rate scanning in the laser process ensures the low production and operation costs. Non-contact in the laser process avoids the process problems such as scratch, and ensures the high yield in the production process.

Figure 5:
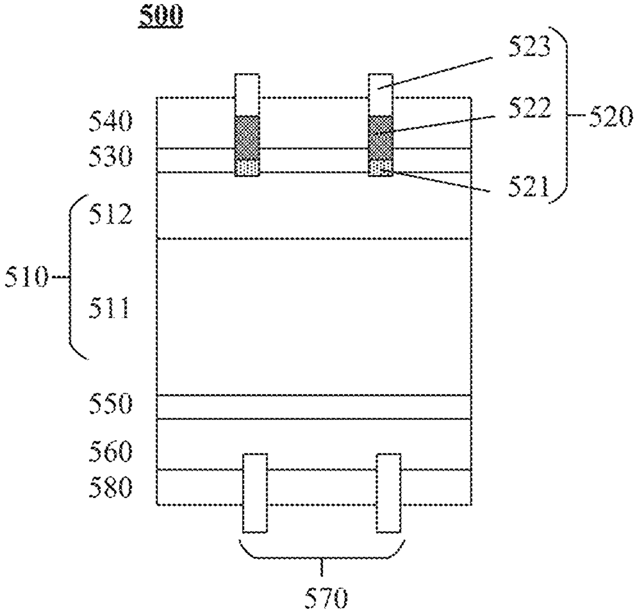
FIG. 5 is a schematic view of a solar cell structure according to an embodiment of the present disclosure.

Moreover, the embodiments of the present disclosure further provide a solar cell structure. As shown in FIG. 5, the solar cell structure 500 includes:

a base 510; and a Tunnel Oxide Passivated Contact (TOPCon) structure 520 arranged on the base 510, in which the TOPCon structure 520 includes a first tunnel layer 521, a first polysilicon contact layer 522 and a first metal electrode 523, which are patterned and are sequentially stacked on one another, in which projections of the first tunnel layer 521, the first polysilicon contact layer 522 and the first metal electrode 523 on a surface of the base 510 coincide with each other.

In some embodiments, the solar cell structure further includes:

a first passivation layer 530 and a first antireflection layer 540, in which the first passivation layer and the first antireflection layer are sequentially stacked on one another and cover the surface of the base 510 in a region absent of the TOPCon structure 520.

In some embodiments, the base 510 includes:

a crystalline silicon substrate 511; and a P-type emitter layer 512 arranged on a surface of the crystalline silicon substrate 511.

In some embodiments, the solar cell structure further includes:

a second tunnel layer 550 and a second polysilicon contact layer 560, in which the second tunnel layer and the second polysilicon contact layer are sequentially stacked on one another and cover a rear side of the base 510;

a second metal electrode 570 arranged on a surface of the second polysilicon contact layer 560; and a second passivation layer 580 arranged on the surface of the second polysilicon contact layer 560 in a region absent of the second metal electrode 570.

The solar cell structure provided by the embodiments of the present disclosure may be made by any one of the above manufacturing methods provided by the embodiments of the present disclosure. This solar cell structure is based on the same inventive concept as the manufacturing method as describe above. The detailed implementation may be understood according to the relevant description in the embodiments of the above manufacturing methods, which will not be repeated herein.

Figure 6:
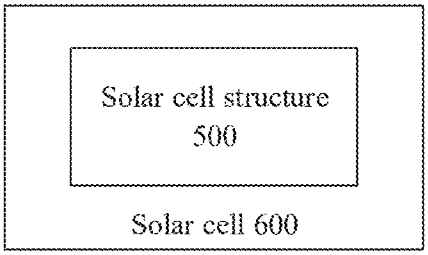
FIG. 6 is a block diagram of a composition structure of a solar cell according to an embodiment of the present disclosure.

Moreover, the embodiments of the present disclosure further provide a solar cell. As shown in FIG. 6, this solar cell 600 includes one or more solar cell structures 500 as described above. Further, one or more solar cell structures 500 in this solar cell 600 may be synchronously formed in the production process according to the operations in the above manufacturing method. This solar cell is based on the same inventive concept as the manufacturing method and the solar cell structure as described above. The detailed implementation may be understood according to the relevant description in any of the above embodiments, which will not be repeated herein.

It may be understood that although some invention embodiments presently considered useful have been discussed in the above disclosure by way of various examples, it should be understood that such details are for illustrative purposes only, and the appended claims are not limited to the disclosed embodiments. On the contrary, the claims are intended to include all modifications and any combination of equivalents consistent with the essence and scope of the embodiments of the present disclosure.

The basic concepts have been described above. Obviously, for those skilled in the art, the above invention disclosure is merely an example and does not constitute a limitation of the present disclosure. Although it is not explicitly explained herein, various modifications, improvements and amendments may be made to the present disclosure by those skilled in the art. Such modifications, improvements and amendments are suggested in the present disclosure. Thus, such modifications, improvements and amendments still fall within the spirit and scope of the exemplary embodiments of the present disclosure.

Meanwhile, specific wordings are used herein to describe embodiments of the present disclosure. For example, wordings "one embodiment", "an embodiment" and/or "some embodiments" indicates a certain feature, structure or characteristic related to at least one embodiment of the present disclosure. Thus, it should be emphasized and noted that "an embodiment" or "one embodiment" or "an alternative embodiment" mentioned twice or more at different positions in this specification do not necessarily refer to a same embodiment. Further, some certain features, structures or characteristics in one or more embodiments of the present disclosure may be appropriately combined.

Further, unless explicitly explained in the claims, the order of treatment elements and sequences, the use of numbers and letters, or the use of other names described in the present disclosure are not intended to limit the order of the procedures and methods in the present disclosure. Although some invention embodiments presently considered useful have been discussed in the above disclosure by way of various examples, it should be understood that such details are for illustrative purposes only, and the appended claims are not limited to the disclosed embodiments. On the contrary, the claims are intended to include all modifications and equivalent combinations consistent with the essence and scope of the embodiments of the present disclosure. For example, although the system components described above may be implemented by a hardware device, they may also be implemented by a software-only solution, for example installing the described system on an existing server or mobile device.

Similarly, it should be noted that in order to simplify the expression disclosed in the present disclosure to facilitate understanding of one or more embodiments of the present disclosure, in the foregoing description of the embodiments of the present disclosure, multiple features may be combined into one embodiment, the accompanying drawings or the description thereof. However, such disclosure method does not mean that more features are required for the object in the present disclosure than features mentioned in the claims. In fact, the features in the embodiments are fewer than all of the features in a single embodiment disclosed above.

Numbers describing the number of compositions and attributes are used in some embodiments. It should be understood that such numbers for describing embodiments are modified in some examples using the modifiers "about", "approximately" or "substantially". Unless otherwise specified, the modifiers "about", "approximately" or "substantially" indicate that ±20% variation is allowed for the numbers. Accordingly, in some embodiments, the numerical parameters used in the specification and claims are approximate values, which may vary depending on the desired characteristics of the individual embodiments. In some embodiments, the numerical parameters should consider specified significant digits and use a general digit reservation approach. Although the numerical ranges and parameters used to confirm the breadth of their ranges in some embodiments of the present disclosure are approximate values, in specific embodiments, such values are set as precisely as possible.

Although the present disclosure has been described with reference to the current specific embodiments, it should be recognized by those of ordinary skill in the art that the above embodiments are merely for illustration of the present disclosure, and various equivalent changes or substitutions may be made without departing from the spirit of the present disclosure. Thus, as long as changes and modifications to the above embodiments are within the spirit of the present disclosure, they will fall within the scope of claims of the present disclosure.

The invention claimed is:

1. A method for manufacturing a solar cell structure, comprising:

forming a precursor structure on a surface of a base, wherein the precursor structure comprises a first tunnel layer covering the surface of the base, and an amorphous silicon layer covering a surface of the first tunnel layer;

patterning the amorphous silicon layer by laser annealing to form a patterned first polysilicon contact layer in only the amorphous silicon layer;

laser oxidizing the patterned first polysilicon contact layer to oxidize a portion of a thickness of the patterned first polysilicon contact layer, to form a patterned silicon oxide mask layer;

removing at least one of the amorphous silicon layer or the first polysilicon contact layer in a region which is not covered by the patterned silicon oxide mask layer;

removing the silicon oxide mask layer and the first tunnel layer in a region which is not covered by the silicon oxide mask layer; and forming a first metal electrode on a surface of a remaining portion of the first polysilicon contact layer, wherein after the laser annealing and before removing at least one of the amorphous silicon layer or the first polysilicon contact layer in a region which is not covered by the patterned silicon oxide mask layer, a projection of a patterned region of the silicon oxide mask layer in a direction perpendicular to the surface of the base coincides with and is same as a projection of a patterned region of the first polysilicon contact layer in the direction perpendicular to the surface of the base.

2. The manufacturing method according to claim 1, wherein forming the precursor structure on the surface of the base comprises:

preparing a silicon oxide material on the surface of the base to form the first tunnel layer; and preparing an amorphous silicon material doped with boron element on the surface of the first tunnel layer to form the amorphous silicon layer.

3. The manufacturing method according to claim 1, wherein annealing the amorphous silicon layer to form the first polysilicon contact layer comprises:

annealing the amorphous silicon layer in a vacuum environment or an inert gas environment to form the first polysilicon contact layer.

4. The manufacturing method according to claim 1, wherein a thickness of the silicon oxide mask layer is less than a thickness of the remaining portion of the first polysilicon contact layer.

5. The manufacturing method according to claim 1, wherein the thickness of the silicon oxide mask layer is between 10 nanometers and 200 nanometers, and the thickness of the first polysilicon contact layer is between 30 nanometers and 200 nanometers.

6. The manufacturing method according to claim 1, wherein a thickness of the amorphous silicon layer is between 50 nanometers and 500 nanometers.

7. The manufacturing method according to claim 1, wherein removing at least one of the amorphous silicon layer or the first polysilicon contact layer in the region which is not covered by the patterned silicon oxide mask layer comprises:

cleaning at least one of the amorphous silicon layer or the first polysilicon contact layer in the region which is not covered by the patterned silicon oxide mask layer through an alkali etching process.

8. The manufacturing method according to claim 1, wherein removing the silicon oxide mask layer and the first tunnel layer in the region which is not covered by the silicon oxide mask layer comprises:

removing the silicon oxide mask layer and the first tunnel layer in the region which is not covered by the silicon oxide mask layer through an acid etching process.

9. The manufacturing method according to claim 1, wherein forming the first metal electrode on the surface of the remaining portion of the first polysilicon contact layer comprises:

screen printing a patterned metal slurry on the surface of the first polysilicon contact layer; and sintering the metal slurry to form the first metal electrode.

10. The manufacturing method according to claim 1, further comprising:

performing boron ion doping on a surface of a crystalline silicon substrate to form a P-type emitter, wherein the crystalline silicon substrate and the P-type emitter form the base.

11. The manufacturing method according to claim 10, further comprising:

sequentially stacking, on a surface of the base on which the first metal electrode is formed, a first passivation layer and a first antireflection layer, wherein the first passivation layer and the first antireflection layer cover a region absent of the first metal electrode.

12. The manufacturing method according to claim 10, further comprising:

sequentially forming a second tunnel layer and a second polysilicon contact layer on a rear side of the base, wherein a doping polarity of the second polysilicon contact layer is opposite to a doping polarity of the first polysilicon contact layer;

forming a second metal electrode on a surface of the second polysilicon contact layer; and forming a second passivation layer on the surface of the second polysilicon contact layer in a region absent of the second metal electrode.

13. The method according to claim 1, wherein projections of a remaining first polysilicon silicon contact layer and of a remaining first tunnel layer after removing the silicon oxide mask layer and the first tunnel layer in a region which is not covered by the silicon oxide mask layer, as well as of the first metal electrode on the surface of the base coincide with and are same as each other.

14. The method according to claim 1, wherein a patterned region corresponding to the laser annealing is consistent with a patterned region corresponding to the laser oxidizing, and the laser annealing and the laser oxidizing are realized by a same laser beam.

15. The method according to claim 1, wherein the patterned polysilicon contact layer not oxidized forms a patterned polysilicon thin film layer, and each of the patterned polysilicon thin film layer and the silicon oxide mask layer has a width ranging from 5 μm to 30 μm.

* * * * *